United States Patent
Takei et al.

(10) Patent No.: US 8,088,546 B2
(45) Date of Patent: Jan. 3, 2012

(54) UNDERLAYER COATING FORMING COMPOSITION FOR LITHOGRAPHY CONTAINING NAPHTHALENE RING HAVING HALOGEN ATOM

(75) Inventors: Satoshi Takei, Toyama (JP); Takahiro Sakaguchi, Toyama (JP); Tomoyuki Enomoto, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 63 days.

(21) Appl. No.: 11/630,891

(22) PCT Filed: Jun. 24, 2005

(86) PCT No.: PCT/JP2005/011645
§ 371 (c)(1),
(2), (4) Date: Dec. 27, 2006

(87) PCT Pub. No.: WO2006/003850
PCT Pub. Date: Jan. 12, 2006

(65) Prior Publication Data
US 2007/0238029 A1 Oct. 11, 2007

(30) Foreign Application Priority Data
Jul. 2, 2004 (JP) .................................. 2004-196955

(51) Int. Cl.
*G03F 7/004* (2006.01)
(52) U.S. Cl. .................. 430/270.1; 430/271.1; 430/329; 430/330
(58) Field of Classification Search .............. 430/270.1, 430/271.1, 322, 325, 329, 330, 907, 921, 430/922, 925, 927; 526/242, 250, 251, 293, 526/294, 296
See application file for complete search history.

(56) References Cited

U.S. PATENT DOCUMENTS

| | | | | |
|---|---|---|---|---|
| 4,178,319 A | * | 12/1979 | Chattha | 525/188 |
| 5,380,621 A | | 1/1995 | Dichiara et al. | |
| 5,733,714 A | * | 3/1998 | McCulloch et al. | 430/325 |
| 6,042,990 A | | 3/2000 | Shao et al. | |
| 6,136,507 A | * | 10/2000 | Morigaki | 430/283.1 |
| 6,228,552 B1 | | 5/2001 | Okino et al. | |
| 6,303,266 B1 | * | 10/2001 | Okino et al. | 430/270.1 |
| 6,653,049 B2 | * | 11/2003 | Pavelchek et al. | 430/272.1 |
| 6,803,168 B1 | * | 10/2004 | Padmanaban et al. | 430/270.1 |
| 2002/0077426 A1 | | 6/2002 | Iguchi et al. | |
| 2003/0215736 A1 | * | 11/2003 | Oberlander et al. | 430/270.1 |
| 2006/0211256 A1 | * | 9/2006 | Takei et al. | 438/725 |

FOREIGN PATENT DOCUMENTS

| | | |
|---|---|---|
| EP | 0 851 300 A1 | 7/1998 |
| JP | A-6-84789 | 3/1994 |
| JP | A-9-274318 | 10/1997 |
| JP | A-10-90908 | 4/1998 |
| JP | A-10-142799 | 5/1998 |
| JP | A-10-186671 | 7/1998 |
| JP | A-2002-14474 | 1/2002 |
| JP | A-2002-47430 | 2/2002 |
| JP | A-2002-128847 | 5/2002 |
| JP | A-2002-190519 | 7/2002 |
| JP | A-2005-84621 | 3/2005 |
| WO | WO 02/05035 | 1/2002 |
| WO | WO 2004/092840 | * 10/2004 |

OTHER PUBLICATIONS

Jun. 30, 2010 European Search Report issued in EP 05 76 5125.
Irie et al., "A Study of an Organic Bottom Antireflective Coating for 157-nm Lithography", Journal of Photopolymer Science and Technology Tech. Assoc. Photopolymers, 2003, pp. 565-572, vol. 16 No. 4, Japan.
Cho, W.J., "Reactivity of 4-Halogeno 1-Vinyl Naphthalenes in Cationic Polymerization", Journal of Polymer Science: Polymer Chemistry, Jun. 1980, pp. 1995-2000, vol. 18, No. 6.

\* cited by examiner

*Primary Examiner* — Anca Eoff
(74) *Attorney, Agent, or Firm* — Oliff & Berridge, PLC

(57) ABSTRACT

There is provided an underlayer coating forming composition for lithography, and an underlayer coating having a high dry etching rate compared with photoresist, and causing no intermixing with the photoresist, which are used in lithography process of manufacture of semiconductor device. Concretely, it is an underlayer coating forming composition comprising a polymer having a structural unit containing naphthalene ring substituted with halogen atom in a molar ratio of 0.3 or more in the structural units constituting the polymer, a solvent.

10 Claims, No Drawings

UNDERLAYER COATING FORMING COMPOSITION FOR LITHOGRAPHY CONTAINING NAPHTHALENE RING HAVING HALOGEN ATOM

TECHNICAL FIELD

The present invention relates to a novel underlayer coating forming composition for lithography, an underlayer coating formed from the composition and a method for forming photoresist pattern by use of the underlayer coating. In addition, the present invention relates to an underlayer coating that can be used for an underlayer anti-reflective coating formed between a semiconductor substrate and a photoresist for preventing reflection of exposure irradiation light from the semiconductor substrate in a lithography process of the manufacture of semiconductor devices, a flattening coating for flattening a semiconductor substrate having unevenness, a coating for preventing contamination of a photoresist layer due to substances generated from a semiconductor substrate on baking under heating, and the like; an underlayer coating forming composition for lithography for forming the underlayer coating. Further, the present invention relates to a composition for forming underlayer coating for lithography that can be used for filling holes formed on a semiconductor substrate.

BACKGROUND ART

Conventionally, in the manufacture of semiconductor devices, micro-processing by lithography using a photoresist has been carried out. The micro-processing is a processing method comprising forming a thin film of a photoresist on a semiconductor substrate such as a silicon wafer or the like, irradiating actinic rays such as ultraviolet rays through a mask pattern on which a pattern for a semiconductor device is depicted, developing it to obtain a photoresist pattern, and etching the substrate using the photoresist pattern as a protective film, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of reflection from a substrate have become serious problems. Accordingly, it has been widely studied to provide an anti-reflective coating between the photoresist and the substrate (Bottom Anti-Reflective Coating, BARC) in order to resolve the problem. As the anti-reflective coating, from a viewpoint of easy of use, many considerations have been done on organic anti-reflective coatings made of a polymer having a light absorbing group and the like. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule.

The properties desired for organic anti-reflective coating include high absorbance to light and radioactive rays, no intermixing with the photoresist layer (being insoluble in photoresist solvents), no diffusion of low molecular substances from the anti-reflective coating into the topcoat photoresist upon baking under heating, and a higher dry etching rate than the photoresist.

In recent years, in order to solve interconnection delay that has become clear with miniaturization in pattern rule of semiconductor devices, it has been considered to use copper as interconnect material, and to apply Dual Damascene process as interconnect forming method on the semiconductor device. And, in Dual Damascene process, via holes are formed and an anti-reflective coating is formed on a substrate having a high aspect ratio. Therefore, the anti-reflective coating for use in this process is required to have filling property by which holes can be filled without gap, flattening property by which a flat coating can be formed on the surface of substrate, and the like.

However, it is difficult to apply organic material for anti-reflective coating on a substrate having a high aspect ratio, and in recent years, material with particular emphasis on filling property or flattening property has been developed (see, for example Patent Documents 1, 2 and 3).

In addition, in the production of devices such as semiconductors, in order to reduce poisoning effect of a photoresist layer induced by a dielectric layer, there is disclosed a method in which a barrier layer formed from a composition containing a crosslinkable polymer and the like is provided between the dielectric layer and the photoresist layer (see, for example Patent Document 4).

As mentioned above, in the recent manufacture of semiconductor devices, in order to attain several effects represented by anti-reflective effect, it comes to provide an organic underlayer coating formed from a composition containing an organic compound between a semiconductor substrate and a photoresist layer, that is, as an underlayer of the photoresist. Further, compositions for underlayer coating have been considered, and it is desired to develop a new material for underlayer coating from the diversity of required characteristics.

On the other hand, an anti-reflective coating composition containing a polyvinyl naphthalene is known (see, for example Patent Document 5). An anti-reflective coating forming composition for lithography having a certain naphthalene ring is also known (see, for example Patent Documents 6 and 7). Further, a method for forming pattern by use of a naphthol novolak is known (see, for example Patent Document 8).

Patent Document 1: JP-A-2002-47430 (2002)
Patent Document 2: JP-A-2002-190519 (2002)
Patent Document 3: WO 02/05035 pamphlet
Patent Document 4: JP-A-2002-128847 (2002)
Patent Document 5: JP-A-6-84789 (1994)
Patent Document 6: JP-A-10-090908 (1998)
Patent Document 7: JP-A-10-186671 (1998)
Patent Document 8: JP-A-2002-14474 (2002)

DISCLOSURE OF INVENTION

Problem to be Solved by the Invention

An object of the present invention is to provide an underlayer coating forming composition for lithography that can be used for the production of semiconductor devices, and to provide an underlayer coating for lithography that causes no intermixing with a photoresist applied and formed as an upper layer and that has a high dry etching rate compared with the photoresist, and an underlayer coating forming composition for forming the underlayer coating.

Further, an object of the present invention is to provide an underlayer coating for lithography that can be used for an underlayer anti-reflective coating for reducing reflection of exposure irradiation light from a semiconductor substrate to a photoresist layer formed on the substrate in a lithography process of the manufacture of semiconductor devices, a flattening coating for flattening a semiconductor substrate having unevenness, a coating for preventing contamination of a photoresist layer due to substances generated from a semiconductor substrate on baking under heating; a composition for lithography for forming the underlayer coating. And another object of the present invention is to provide a method for forming a photoresist pattern by use of the underlayer coating forming composition.

Means for Solving the Problem

Taking the above-mentioned present status into account, the present inventors eagerly investigated, and as a result of it, they found the use of composition comprising a polymer containing a naphthalene ring substituted with halogen atom makes possible to form an excellent underlayer coating, and they completed the present invention.

That is, the present invention relates to the following aspects. As a first aspect, an underlayer coating forming composition for lithography comprising a polymer having a structural unit of formula (A-1):

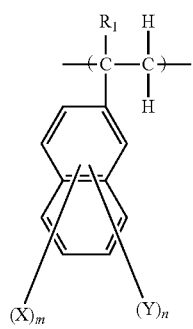

(A-1)

wherein $R_1$ is hydrogen atom or methyl group, X is halogen atom, Y is a group selected from the group consisting of hydrogen atom, $C_{1-6}$alkyl group, $C_{1-6}$alkoxy group, cyano group, nitro group, carboxy group, hydroxy group, $C_{1-6}$alkoxycarbonyl group and $C_{1-6}$thioalkyl group, m is an integer of 1 to 7, n is an integer of 0 to 6 and m+n=7, in case where m and n are 2 or more, X and Y are identical with or different from each other, in a molar ratio of 0.3 or more in structural units constituting the polymer, and a solvent.

As a second aspect, an underlayer coating forming composition for lithography comprising a polymer having structural units of formulae (A-1) and (B-1):

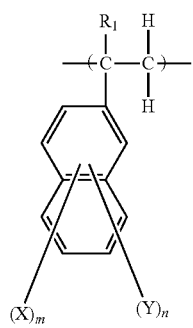

(A-1)

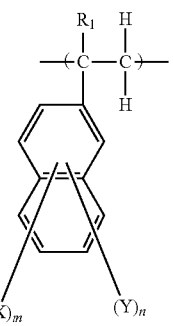

(B-1)

wherein $R_1$, X, Y, m and n have the same meaning as that defined in the first aspect, $R_2$ is hydrogen atom or methyl group, A is hydroxyphenyl group, hydroxy group, 2-hydroxyethyloxy group or —COOR$_3$ wherein $R_3$ is $C_{2-6}$alkyl group substituted with at least one hydroxy group, and a solvent, wherein in structural units constituting the polymer, the structural unit of formula (A-1) is contained in a molar ratio of 0.3 to 0.9 and the structural unit of formula (B-1) is contained in a molar ratio of 0.1 to 0.7.

As a third aspect, an underlayer coating forming composition for lithography comprising a polymer having structural units of formulae (A-1), (C-1) and (D-1):

(A-1)

(C-1)

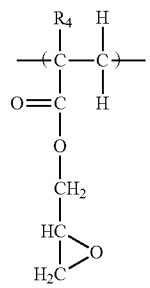

(D-1)

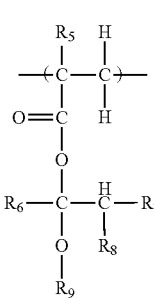

wherein $R_1$, X, Y, m and n have the same meaning as that defined in the first aspect, $R_4$ and $R_5$ independently of each other are hydrogen atom or methyl group, $R_6$, $R_7$ and $R_8$ independently of one another are hydrogen atom or $C_{1-10}$alkyl group, $R_9$ is $C_{1-10}$alkyl group, or $R_8$ and $R_9$ may be bonded together to form a ring, and a solvent, wherein in structural units constituting the polymer, the structural unit of formula (A-1) is contained in a molar ratio of 0.3 to 0.8, the structural unit of formula (C-1) is contained in a molar ratio of 0.1 to 0.6 and the structural unit of formula (D-1) is contained in a molar ratio of 0.1 to 0.6.

As a forth aspect, an underlayer coating forming composition for lithography, comprising a polymer having the structural unit of formula (A-1) as described in the first aspect in a molar ratio of 0.3 or more in structural units constituting the polymer, a crosslinking compound, an acid compound and a solvent.

As a fifth aspect, an underlayer coating forming composition for lithography, comprising a polymer having the structural unit of formula (A-1) as described in the first aspect and the structural unit of formula (B-1) as described in the second aspect, a crosslinking compound, an acid compound and a solvent, wherein in structural units constituting the polymer, the structural unit of formula (A-1) is contained in a molar ratio of 0.3 to 0.9 and the structural unit of formula (B-1) is contained in a molar ratio of 0.1 to 0.7.

As a sixth aspect, the underlayer coating forming composition for lithography as described in any one of the first to fifth aspects, wherein the structural unit of formula (A-1) is a structural unit of formula (A-2):

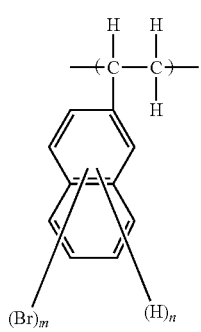

wherein m and n have the same meaning as that defined in the first aspect.

As a seventh aspect, the underlayer coating forming composition for lithography as described in the second or fifth aspects, wherein the structural unit of formula (B-1) is a structural unit of formula (B-2):

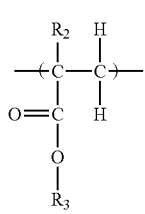

wherein $R_2$ and $R_3$ have the same meaning as that defined in the second aspect.

As an eighth aspect, the underlayer coating forming composition for lithography as described in the fourth or fifth aspects, wherein the crosslinking compound is a compound having two or more nitrogen atoms substituted with hydroxymethyl group or alkoxymethyl group.

As a ninth aspect, the underlayer coating forming composition for lithography as described in the fourth or fifth aspects, wherein the acid compound is a sulfonic acid compound.

As a tenth aspect, the underlayer coating forming composition for lithography as described in the fourth or fifth aspects, wherein the acid compound is a sulfonium salt compound or a iodonium salt compound.

As an eleventh aspect, an underlayer coating obtained by coating the underlayer coating forming composition for lithography as described in any one of the first to tenth aspects on a semiconductor substrate, and baking it.

As a twelfth aspect, a method for forming photoresist pattern for use in manufacture of semiconductor device, comprising coating the underlayer coating forming composition for lithography as described in any one of the first to tenth aspects on a semiconductor substrate, and baking it to form an underlayer coating, forming a photoresist layer on the underlayer coating, exposing the semiconductor substrate covered with the underlayer coating and the photoresist layer to light, and developing after the exposure to light.

Effect of the Invention

The underlayer coating forming composition for lithography of the present invention can provide an underlayer coating that can use as an anti-reflective coating effectively absorbing light reflected from a semiconductor substrate and causing no intermixing with a photoresist, in micro-processing by use of KrF excimer laser beam (wavelength 248 nm) and ArF excimer laser beam (wavelength 193 nm) and the like.

The underlayer coating forming composition of the present invention can provide an excellent underlayer coating that has a high dry etching rate compared with photoresists, and cause no intermixing with photoresists.

The underlayer coating forming composition for lithography of the present invention can attain a high filling property inside holes without occurrence of void (gap) in semiconductor substrates having holes. In addition, the composition can fill and flatten unevenness on semiconductor substrates having holes. The film thickness of photoresists formed thereon and so on can be improved in uniformity. Therefore, good photoresist pattern form can be formed even in the process by use of semiconductor substrates having holes.

Further, the underlayer coating forming composition of the present invention can provide an underlayer coating that can be used as a flattening coating and a coating for preventing contamination of a photoresist layer, and the like.

Furthermore, the underlayer coating forming composition of the present invention enables the formation of photoresist pattern in lithography process of the production of semiconductor device to be carried out easily and in a high accuracy.

BEST MODE FOR CARRYING OUT THE INVENTION

The underlayer coating forming composition for lithography of the present invention comprises a polymer having a structural unit of formula (A-1), and a solvent. Further, the underlayer coating forming composition of the present invention can further contain a crosslinking compound, an acid compound, a light absorbing compound and a surfactant, and the like.

The proportion of the solid content in the underlayer coating forming composition of the present invention is not specifically limited so long as each component is homogeneously dissolved, but is for example 0.5 to 70 mass %, or for example 1 to 50 mass %, or 5 to 30 mass %. In this specification, the solid content means all components in the underlayer coating forming composition from which the solvent component is excluded.

The proportion of the polymer having a structural unit of formula (A-1) in the solid content is 60 mass % or more, for example 60 to 100 mass %, or 60 to 99 mass %, or 70 to 95 mass %.

The molecular weight of the polymer having a structural unit of formula (A-1) contained in the underlayer coating forming composition of the present invention is for example 1000 to 300000, or for example 1500 to 100000, or 2000 to 50000, or 3000 to 30000 in terms of weight average molecular weight.

When the weight average molecular weight is lower than the above-mentioned lower limit, it is highly possible that the underlayer coating forming composition would be sublimated in the baking step carried out after coating the composition on a semiconductor substrate. Therefore, it is assumed that it causes disadvantages such as an incomplete formation of underlayer coating, pollution of apparatuses, and the like. When the weight average molecular weight is higher than the above-mentioned upper limit, it is assumed that the flowability of the underlayer coating forming composition is lowered, filling into the holes formed on semiconductor substrates becomes insufficient, void or gap in the holes occurs, and it brings about obstacles to the final processing of semiconductor substrate.

The underlayer coating forming composition of the present invention comprises a polymer having a structural unit of formula (A-1), and a solvent. The structural unit of formula (A-1) is contained in a molar ratio of 0.3 or more, or 0.5 or more in structural units constituting the polymer. When the proportion of the structural unit of formula (A-1) is lower than the lower limit, the formed underlayer has an insufficient anti-reflect effect and etching rate.

In formula (A-1), $R_1$ is hydrogen atom or methyl group, X is halogen atom, Y is a group selected from the group consisting of hydrogen atom, $C_{1-6}$alkyl group, $C_{1-6}$alkoxy group, cyano group, nitro group, carboxy group, hydroxy group, $C_{1-6}$alkoxycarbonyl group and $C_{1-6}$thioalkyl group, m is an integer of 1 to 7, n is an integer of 0 to 6 and m+n=7, in case where m and n are 2 or more, X and Y may be identical with or different from each other.

$C_{1-6}$alkyl group includes for example methyl group, ethyl group, n-butyl group, n-hexyl group, isopropyl group, tert-butyl group, isobutyl group, cyclopropyl group and cyclohexyl group, and so on. $C_{1-6}$alkoxy group includes for example methoxy group, ethoxy group, isopropoxy group, n-pentyloxy group and cyclohexyloxy group, and so on. $C_{1-6}$alkoxycarbonyl group includes for example methoxycarbonyl group, ethoxycarbonyl group, isopropoxycarbonyl group and cyclopentyloxycarbonyl group, and so on. $C_{1-6}$thioalkyl group includes for example methylthio group, ethylthio group, isopropylthio group and cyclohexylthio group, and so on.

The polymer having a structural unit of formula (A-1) can be produced from a monomer compound having polymerizable unsaturated bond, of formula (1-a).

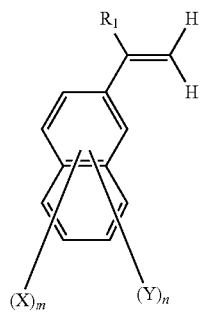

(1-a)

The polymer can be produced by dissolving the monomer compound of formula (1-a) and optionally a chain transfer agent in a suitable organic solvent, then subjecting the resulting solution in which a polymerization initiator is added to polymerization, and then optionally adding a short-stop. The added amount of the chain transfer agent, polymerization initiator and short-stop is for example 1 to 10 mass %, 1 to 10 mass % and 0.01 to 0.5 mass %, respectively, based on the mass of the monomer.

The organic solvent used for the reaction includes for example propylene glycol monomethyl ether acetate, propylene glycol monomethyl ether, propylene glycol monopropyl ether, ethyl lactate, tetrahydrofuran, cyclohexanone, dimethylacetamide, N-methylpyrrolidone and dimethylformamide, etc., the chain transfer agent includes dodecane thiol and dodecyl thiol, etc., the polymerization initiator includes for example azobisisobutyronitrile and azobiscyclohexane carbonitrile, etc., and the short-stop includes for example 4-methoxyphenol, etc. The reaction temperature and the reaction time are suitably selected from 50 to 200° C. and 0.5 to 50 hours, respectively.

The concrete examples of the monomer compound of formula (1-a) are for example 8-bromo-2-vinyl naphthalene, 5-bromo-2-vinyl naphthalene, 5,8-dibromo-2-vinyl naphthalene, 8-chloro-2-vinyl naphthalene, 5-chloro-2-vinyl naphthalene, 5,8-dichloro-2-vinyl naphthalene, 8-iodo-2-vinyl naphthalene, 5-iodo-2-vinyl naphthalene, 5-nitro-8-bromo-2-vinyl naphthalene, 5-cyano-8-bromo-2-vinyl naphthalene, 5-methyl-8-bromo-2-vinyl naphthalene, 5-ethyl-8-bromo-2-vinyl naphthalene, 5-butyl-8-bromo-2-vinyl naphthalene, 5-hydroxy-8-bromo-2-vinyl naphthalene, 5-carboxy-8-bromo-2-vinyl naphthalene, 5-methylcarboxy-8-bromo-2-vinyl naphthalene and 5,8-diiodo-2-vinyl naphthalene, etc.

In the production of the polymer having a structural unit of formula (A-1), the monomer of formula (1-a) can be used alone or in a combination of two or more.

It is preferable from viewpoint of light absorbing property or etching rate that the structural unit of formula (A-1) is a structural unit of formula (A-2) containing naphthalene ring structure having bromine substituent.

In the production of the polymer having a structural unit of formula (A-1), besides the monomer of formula (1-a), other polymerizable monomer compounds can be used. In this case, in order to satisfy the condition that the structural unit of formula (A-1) is contained in a molar ratio of 0.3 or more, or 0.5 or more in the structural units constituting the polymer, it is required that the monomer compounds of formula (1-a) are used in molar ratio of 0.3 or more, or 0.5 or more in the total monomer compounds used in the production of the polymer. That is, in case where other polymerizable monomer compounds are used, they are used in molar ratio of 0.7 or less, or 0.5 or less in the total monomer compounds. In addition, when other polymerizable monomer compound is used, it can be used alone or in a combination of two or more in the production of the polymer.

The other polymerizable monomer compounds are any monomers that are polymerizable with the monomer compound of formula (1-a). Such compounds include acrylic acid, methacrylic acid, acrylic acid ester compounds, methacrylic acid compounds, acrylamide compounds, methacrylamide compounds, vinyl compounds, styrene compounds, maleimide compounds, maleic anhydride, and acrylonitrile, etc.

The acrylic acid ester compounds include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecylacrylate, and 5-acryloyloxy-6-hydroxynorbornene-2-carboxylic-6-lactone, etc.

The methacrylic acid ester compounds include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2, -trichloroethyl methacrylate, methyl methacrylate, isobutyl methacrylate, 2-ethylhexyl methacrylate, isodecyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxynorbornene-2-carboxylic-6-lactone, and 2,2,3,3,4,4,4-heptafluorobutyl methacrylate, etc.

The acrylamide compounds include acrylamide, N-methylacrylamide, N-ethylacrylamide, N-benzylacrylamide, N-phenylacrylamide, and N,N-dimethylacrylamide, etc.

The methacrylamide compounds include metacrylamide, N-methylacrylamide, N-ethylacrylamide, N-benzylacrylamide, N-phenylacrylamide, and N,N-dimethylacrylamide, etc.

The vinyl compounds include vinyl alcohol, methylvinyl ether, benzylvinyl ether, 2-hydroxyethylvinyl ether, phenylvinyl ether, 1-vinylnaphthalene, 2-vinylnaphthalene, 9-vinylanthracene and propylvinyl ether, etc.

The styrene compounds include styrene, methylstyrene, chlorostyrene, bromostyrene, and hydroxystyrene, etc.

The maleimide compounds include maleimide, N-methylmaleimide, N-phenylmaleimide, and N-cyclohexylmaleimide, etc.

As the polymer having structural units of formula (A-1) contained in the underlayer coating forming composition of the present invention, can be used the polymer having structural units of formulae (A-1) and (B-1) wherein in structural units constituting the polymer, the structural unit of formula (A-1) is contained in a molar ratio of 0.3 to 0.9 and the structural unit of formula (B-1) is contained in a molar ratio of 0.1 to 0.7. The polymer having structural units of formulae (A-1) and (B-1) wherein in structural units constituting the polymer, the structural unit of formula (A-1) is contained in a molar ratio of 0.5 to 0.9 and the structural unit of formula (B-1) is contained in a molar ratio of 0.1 to 0.5 can be also used.

In formula (B-1), $R_2$ is hydrogen atom or methyl group, $A_1$ is hydroxyphenyl group, hydroxy group, 2-hydroxyethyloxy group or —$COOR_3$ wherein $R_3$ is $C_{2-6}$alkyl group substituted with at least one hydroxy group.

The $C_{2-6}$alkyl group substituted with at least one hydroxy group includes for example 2-hydroxyethyl group, 2-hydroxypropyl group, 2,3-dihydroxypropyl group, 3-hydroxypropyl group, and 4-hydroxybutyl group, etc.

The polymer having structural units of formulae (A-1) and (B-1) can be produced from the monomer compounds of formulae (1-a) and (1-b) having polymerizable unsaturated bond. The polymer can be produced similarly to the above-mentioned polymerization.

(1-b)

The concrete examples of the monomer compound of formula (1-b) are for example 4-hydroxystyrene, 2-hydroxystyrene, 2-hydroxyethyl acrylate, 2-hydroxyethyl methacrylate, 2-hydroxypropyl acrylate, 2-hydroxypropyl methacrylate, 2,3-dihydroxypropyl acrylate, 4-hydroxybutyl acrylate, 4-hydroxybutyl methacrylate, 2-hydroxybutyl acrylate, vinyl alcohol, and 2-hydroxyethylvinyl ether, etc.

It is preferable from viewpoint of etching rate of the formed underlayer coating or the like that the structural unit of formula (B-1) is a structural unit of formula (B-2) having no aromatic ring structure.

In the production of the polymer having structural units of formulae (A-1) and (B-1), the monomer compounds of formulae (1-a) and (1-b) can be used alone or in a combination of two or more, respectively.

In the production of the polymer having structural units of formulae (A-1) and (B-1), besides the monomer compounds of formulae (1-a) and (1-b), other polymerizable monomer compounds can be also used. In this case, the other polymerizable monomer is used in a range satisfying the condition that the structural unit of formula (A-1) is contained in a molar ratio of 0.3 to 0.9, or 0.5 to 0.9 and the structural unit of formula (B-1) is contained in a molar ratio of 0.1 to 0.7 or 0.1 to 0.5 in the structural units constituting the polymer. For example, in the production of the polymer, the monomer compounds of formulae (1-a) and (1-b) and the other polymerizable monomer compounds can be used in molar ratio of 0.3, 0.1 and 0.6, respectively. Also, in the production of the polymer, the monomer compounds of formulae (1-a) and (1-b) and the other polymerizable monomer compounds can be used in molar ratio of 0.8, 0.1 and 0.1, respectively. When other polymerizable monomer compound is used, it can be used alone or in a combination of two or more.

The other polymerizable monomer compounds include the above-mentioned acrylic acid, methacrylic acid, acrylic acid ester compounds, methacrylic acid compounds, acrylamide compounds, methacrylamide compounds, vinyl compounds, styrene compounds, maleimide compounds, maleic anhydride, and acrylonitrile, etc.

As the polymer having structural units of formula (A-1) contained in the underlayer coating forming composition of the present invention, can be used the polymer having structural units of formulae (A-1), (C-1) and (D-1) wherein in structural units constituting the polymer, the structural unit of formula (A-1) is contained in a molar ratio of 0.3 to 0.8, the structural unit of formula (C-1) is contained in a molar ratio of 0.1 to 0.6 and the structural unit of formula (D-1) is contained in a molar ratio of 0.1 to 0.6. The polymer wherein in structural units constituting the polymer, the structural unit of formula (A-1) is contained in a molar ratio of 0.5 to 0.8, the structural unit of formula (C-1) is contained in a molar ratio of 0.1 to 0.4 and the structural unit of formula (D-1) is contained in a molar ratio of 0.1 to 0.4 can be also used.

In formulae (C-1) and (D-1), $R_4$ and $R_5$ independently of each other are hydrogen atom or methyl group, $R_6$, $R_7$ and $R_8$ independently of one another are hydrogen atom or $C_{1-10}$alkyl group, $R_9$ is $C_{1-10}$alkyl group, or $R_8$ and $R_9$ may be bonded together to form a ring.

The $C_{1-10}$alkyl group includes for example methyl group, ethyl group, n-butyl group, n-hexyl group, n-octyl group, isopropyl group, tert-butyl group, isobutyl group, 2-ethylhexyl group, cyclohexylmethyl group, cyclopropyl group and cyclohexy group, etc. The ring formed by a bond between $R_8$ and $R_9$ includes for example terahydrofuran ring and tetrahydropyran ring, etc.

The polymer having structural units of formulae (A-1), (C-1) and (D-1) can be produced from the monomer compounds of formulae (1-a), (1-c) and (1-d) having polymerizable unsaturated bond. The polymer can be produced similarly to the above-mentioned polymerization.

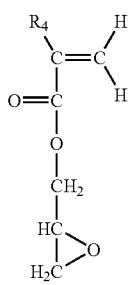

(1-c)

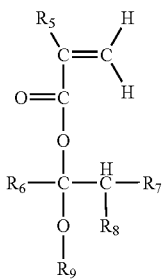

(1-d)

The monomer compound of formula (1-c) is glycidyl acrylate and glycidyl methacrylate.

The concrete examples of the monomer compound of formula (1-d) are methacrylic acid hemiacetal ester compounds such as 1-methoxyethyl methacrylate, 1-ethoxyethyl metacrylate, 1-isopropoxyethyl methacrylate, 1-n-hextyloxyethyl methacrylate, and tetrahydro-2H-pyran-2-yl-methacrylate, etc., acrylic acid hemiacetal ester compounds such as 1-methoxyethyl acrylate, 1-tert-butoxyethyl acrylate, 1-isopropoxyethyl acrylate, 1-n-butoxyethyl acrylate, and tetrahydro-2H-pyran-2-yl-acrylate, etc.

The monomer compounds of formula (1-d) can be produced by reacting acrylic acid or methacrylic acid with a vinyl ether compound of formula (3).

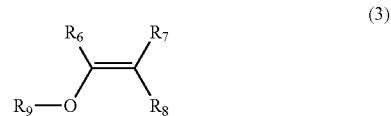

(3)

The reaction of acrylic acid or methacrylic acid with a vinyl ether compound can be carried out by stirring at room temperature by use of phosphoric acid as a catalyst as described in Journal of the Adhesion Society of Japan, Vol. 34, pp. 352-356, for example.

The vinyl ether compound of formula (3) includes for example aliphatic vinyl ether compounds such as methyl vinyl ether, ethyl vinyl ether, isopropyl vinyl ether, n-butyl vinyl ether, 2-ethylhexyl vinyl ether, tert-butyl vinyl ether, cyclohexyl vinyl ether, and the like, cyclic vinyl ether compounds such as 2,3-dihydrofuran, 4-methyl-2,3-dihydrofuran, 2,3-dihydro-4H-pyran and the like.

In the production of the polymer having structural units of formulae (A-1), (C-1) and (D-1), besides the monomer compounds of formulae (1-a), (1-c) and (1-d), other polymerizable monomer compounds can be also used. In this case, the other polymerizable monomer is used in a range satisfying the condition that the structural unit of formula (A-1) is contained in a molar ratio of 0.3 to 0.8 or 0.5 to 0.8, the structural unit of formula (C-1) is contained in a molar ratio of 0.1 to 0.6 or 0.1 to 0.4 and the structural unit of formula (D-1) is contained in a molar ratio of 0.1 to 0.6 or 0.1 to 0.4 in the structural units constituting the polymer. For example, in the production of the polymer, the monomer compounds of formulae (1-a), (1-c) and (1-d) and the other polymerizable monomer compounds can be used in molar ratio of 0.3, 0.2, 0.1 and 0.4, respectively, in total monomer compounds. Also, in the production of the polymer, the monomer compounds of formulae (1-a), (1-c) and (1-d) and the other polymerizable monomer compounds can be used in molar ratio of 0.6, 0.1, 0.2 and 0.1, respectively, in total monomer compounds. When other polymerizable monomer compound is used, it can be used alone or in a combination of two or more.

The other polymerizable monomer compounds include the above-mentioned acrylic acid, methacrylic acid, acrylic acid ester compounds, methacrylic acid compounds, acrylamide compounds, methacrylamide compounds, vinyl compounds, styrene compounds, maleimide compounds, maleic anhydride, and acrylonitrile, etc.

The concrete examples of the polymer having structural units of formula (A-1) contained in the underlayer coating forming composition of the present invention, include for example polymers of the following formulae (4) to (30) to which the present invention is not limited. In the formulae, $p_1$, $p_2$, $p_3$ and $p_4$ are molar ratio of respective structural unit in the polymer.

(4) 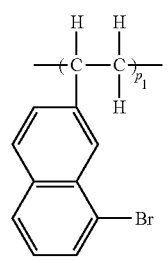
(5) 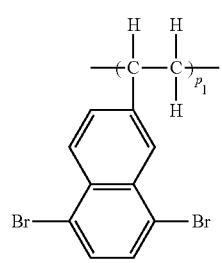
(6) 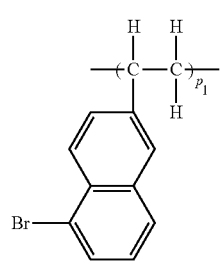
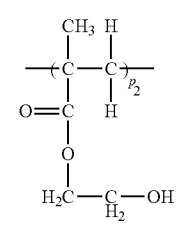
(7) 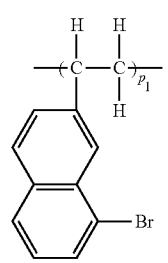
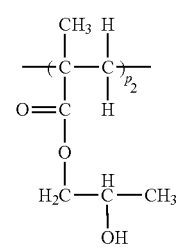
(8) 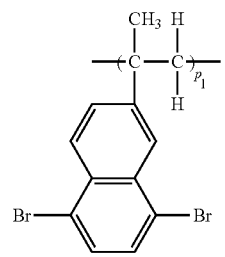
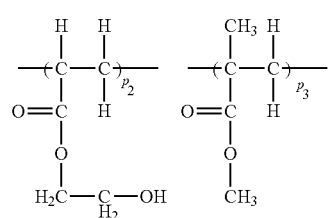
(9) 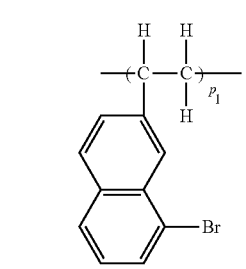
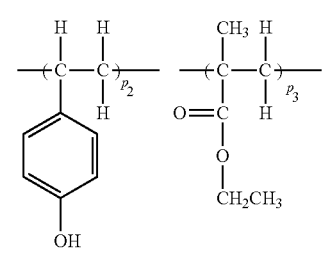
(10) 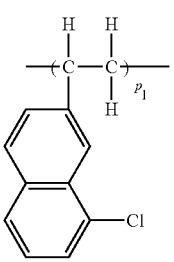
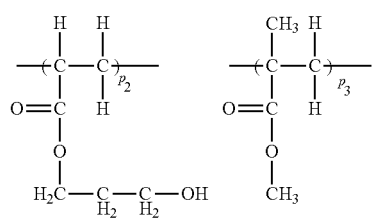

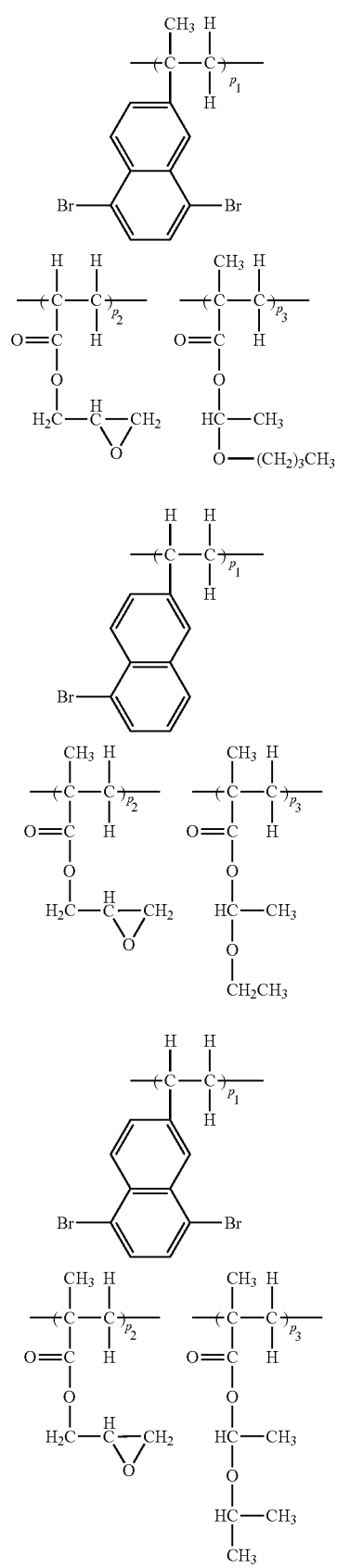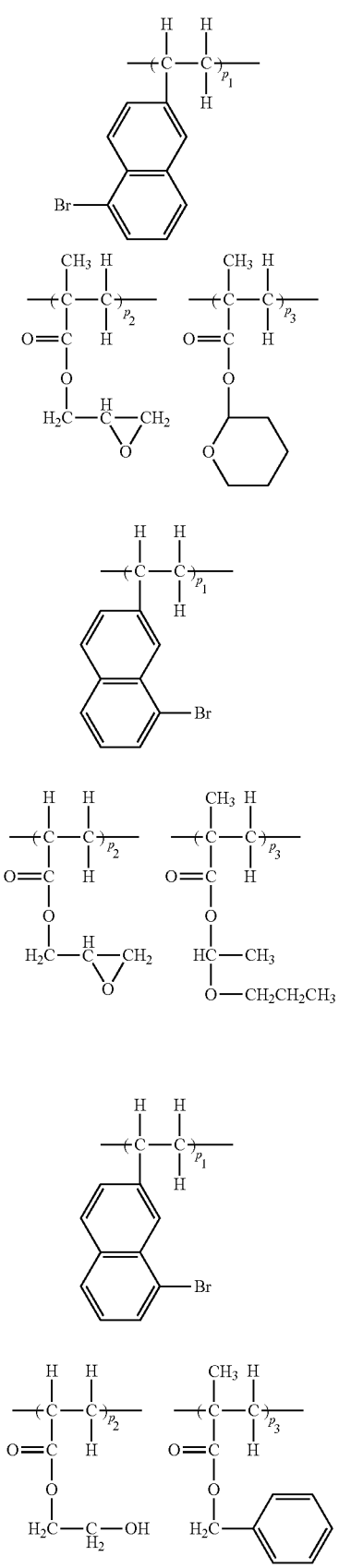

(17)
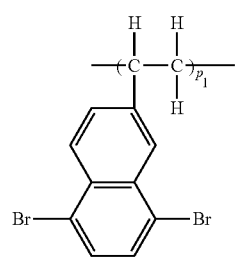
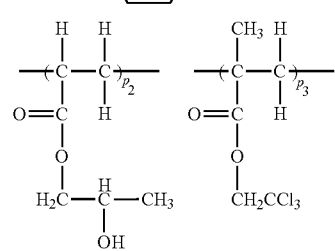
(18)
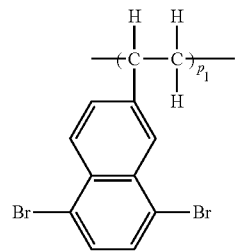
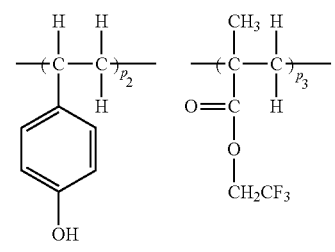
(19)
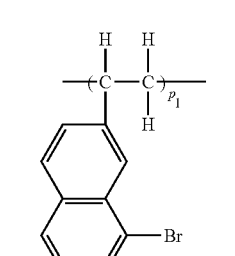
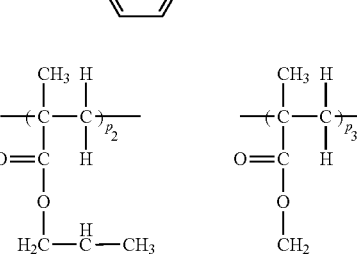
(20)
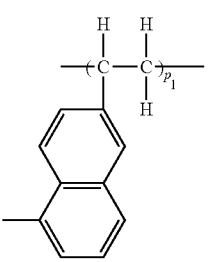
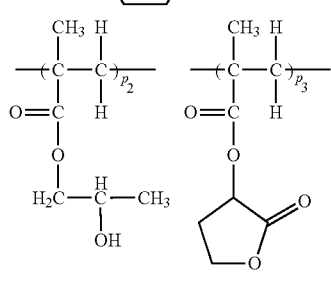
(21)
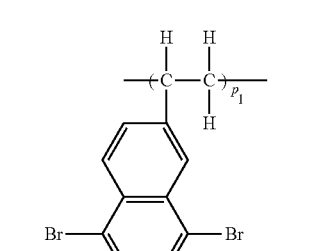
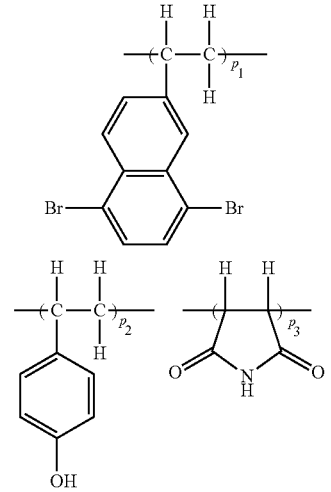
(22)
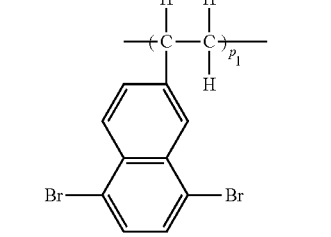
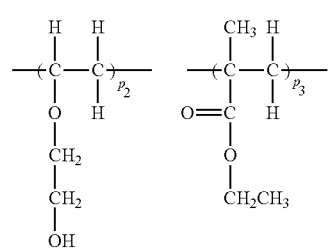

(23) 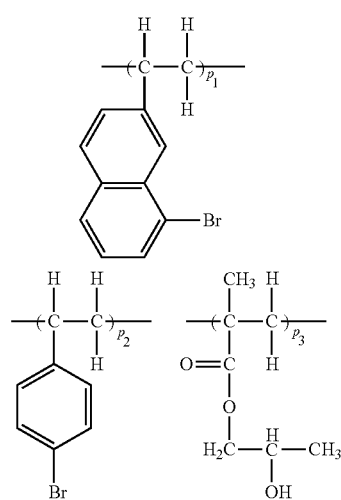
(24) 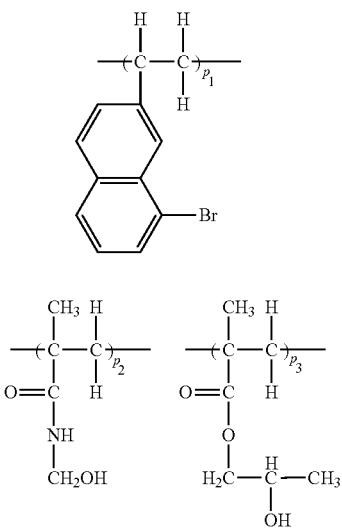
(25) 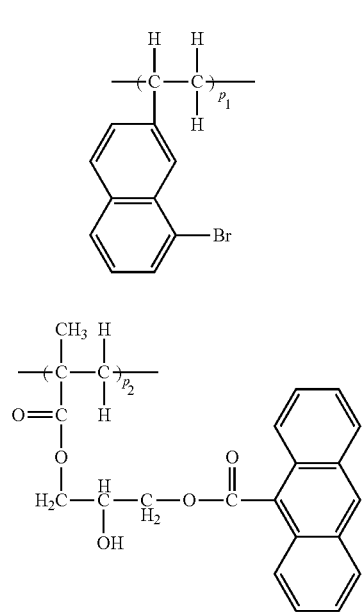
(26) 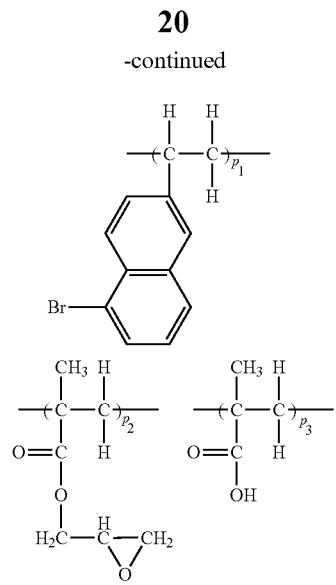
(27) 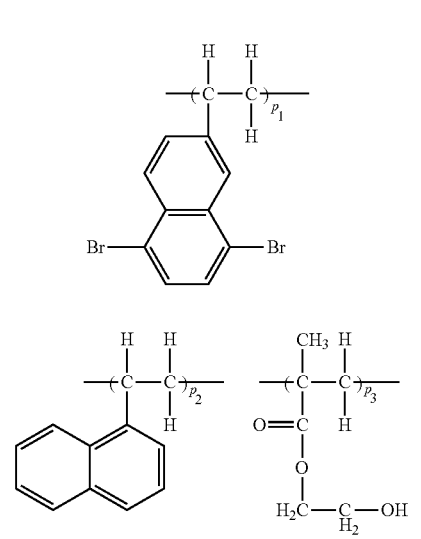
(28) 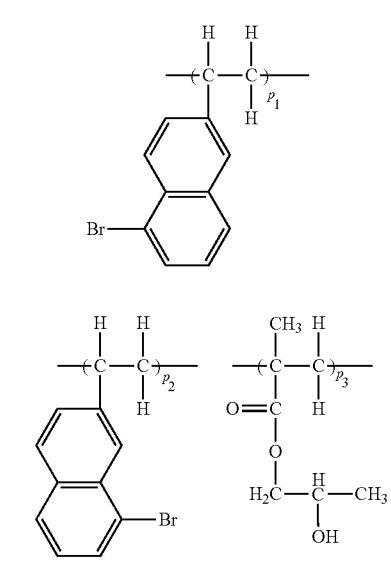

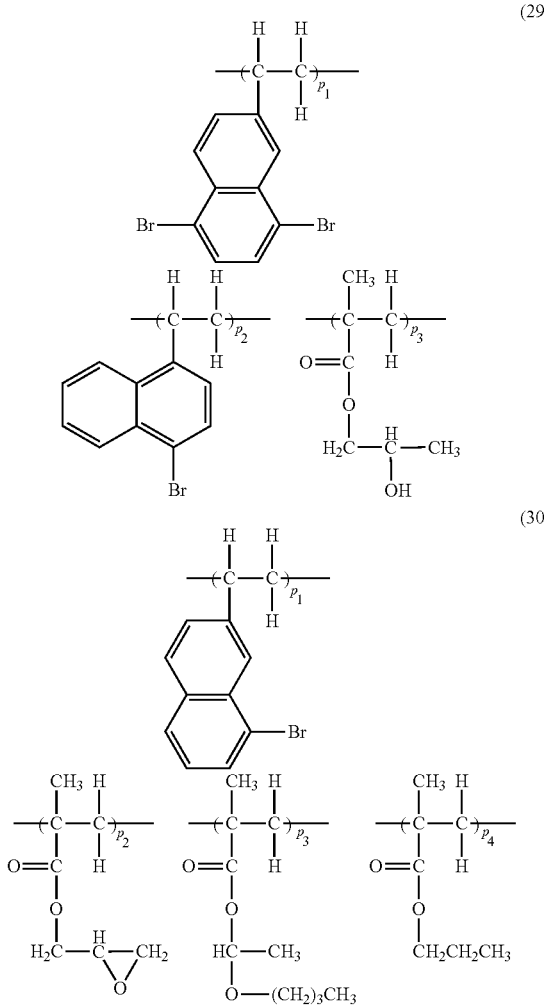

The underlayer coating forming composition of the present invention can contain a crosslinking compound and an acid compound together with the above-mentioned polymer.

The underlayer coating forming composition of the present invention can contain a crosslinking compound and an acid compound together with the above-mentioned polymer having the structural unit of formula (A-1) in a molar ratio of 0.3 or more in structural units constituting the polymer. In this case, the proportion of each component in the solid is as follows: the polymer having the structural unit of formula (A-1) in a molar ratio of 0.3 or more in structural units constituting the polymer: 60 to 99 mass %, or 70 to 95 mass %, the crosslinking compound: 0.5 to 30 mass %, or 1 to 25 mass %, and the acid compound: 0.01 to 10 mass %, or 0.1 to 5 mass %.

In addition, the underlayer coating forming composition of the present invention can contain a crosslinking compound and an acid compound together with the above-mentioned polymer having structural units of formulae (A-1) and (B-1) wherein in structural units constituting the polymer, the structural unit of formula (A-1) is contained in a molar ratio of 0.3 to 0.9 and the structural unit of formula (B-1) is contained in a molar ratio of 0.1 to 0.7. In this case, the proportion of each component in the solid is as follows: the polymer having structural units of formulae (A-1) and (B-1) wherein in structural units constituting the polymer, the structural unit of formula (A-1) is contained in a molar ratio of 0.3 to 0.9 and the structural unit of formula (B-1) is contained in a molar ratio of 0.1 to 0.7: 60 to 99 mass %, or 70 to 95 mass %, the crosslinking compound: 0.5 to 30 mass %, or 1 to 25 mass %, and the acid compound: 0.01 to 10 mass %, or 0.1 to 5 mass %.

The crosslinking compound is not specifically limited, and includes for example compounds having two or more nitrogen atoms substituted by hydroxymethyl group or alkoxymethyl group. Such a compound includes for example melamine compounds, benzoguanamine compounds and urea compounds having two or more nitrogen atoms substituted by hydroxymethyl group or alkoxymethyl group. The concrete examples are methoxymethylated glycoluril, methoxymethylated benzoguanamine and methoxymethylated melamine, etc. The crosslinking compound includes for example hexamethoxymethyl melamine, tetramethoxymethyl benzoguanamine, 1,3,4,6-tetrakis(butoxymethyl)glycoluril, 1,3,4,6-tetrakis(hydroxymethyl )glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc., and further compounds such as methoxymethyl type melamine compounds manufactured by Mitsui Cytec Co., Ltd. (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), etc., methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (high condensation type, trade name: Beckamine J-300S, Beckamine P-955, Beckamine N), and the like. The compounds obtained by condensing the melamine compounds, urea compounds, glycoluril compounds and benzoguanamine compounds that the hydrogen atom of the amino group is substituted by methylol group or alkoxymethyl group, may be also used. For example, the compound includes a compound with a high molecular weight that is produced from a melamine compound (Cymel 303) and a benzoguanamine compound (trade name: Cymel 1123) that is disclosed in U.S. Pat. No. 6,323,310.

As the crosslinking compound, the polymer produced by use of acrylamide compounds or methacrylamide compounds substituted by hydroxymethyl group or alkoxymethyl group such as N-hydroxymethyl acrylamide, N-methoxymethyl methacrylamide, N-ethoxymethyl acrylamide, and N-butoxymethyl methacrylamide, etc. can be used. Such polymers include for example poly(N-butoxymethylacrylamide), a copolymer of N-butoxymethylacrylamide with styrene, a copolymer of N-hydroxymethylmethacrylamide with methylmethacrylate, a copolymer of N-ethoxymethylmethacrylamide with benzylmethacrylate, and a copolymer of N-butoxymethylacrylamide, benzylmethacrylate and 2-hydroxypropylmethacrylate, etc. The polymer has a weight average molecular weight of for example 1000 to 500000, or for example 2000 to 200000, or 3000 to 150000, or 3000 to 50000.

These crosslinking compounds can occur crosslinking reaction due to self-condensation. In addition, in case where crosslinkable group such as hydroxy group and carboxy group, etc. is present on the above-mentioned polymer used together therewith, the crosslinking compound can bring about crosslinking reaction with these groups. And, such a crosslinking reaction leads to the formation of a tough underlayer coating having a crosslink structure. Consequently, the underlayer coating becomes a coating having a further lowered solubility in an organic solvent generally used for the photoresist composition applied thereon, for example ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate and butyl lactate, etc. The crosslinking compound can be used alone or a combination of two or more.

The acid compound includes for example sulfonic acid compounds such as p-toluene sulfonic acid, trifluoromethane sulfonic acid, and pyridinium p-toluenesulfonate, etc., and carboxylic acid compounds such as salicylic acid, sulfosalicylic acid, citric acid, benzoic acid, and hydroxybenzoic acid, etc., and so on. The acid compound is a compound that generates an acid by the action of light or heat. It includes onium salt compounds, sulfone imide compounds, and disulfonyl diazomethane compounds, etc.

The onium salt compounds include iodonium salt compounds such as diphenyl iodonium hexafluorophosphate, diphenyl iodonium trifluoromethane sulfonate, diphenyl iodonium nonafluoro-n-butane sulfonate, diphenyl iodonium perfluoro-n-octane sulfonate, diphenyliodonium camphor sulfonate, bis(4-t-butylphenyl)iodonium camphor sulfonate and bis(4-tert-butylphenyl)iodonium trifluoromethane sulfonate, etc., and sulfonium salt compounds such as triphenylsulfonium hexafluoroantimonate, triphenylsulfonium nonafluororo-n-butane sulfonate, triphenylsulfonium camphor sulfonate and triphenylsulfonium trifluoromethane sulfonate, etc.

The sulfone imide compounds include for example N-(trifluoromethane sulfonyloxy)succinimide, N-(nonafluoro-n-butanesulfonyloxy)succinimide, N-(camphorsulfonyloxy)succinimide and N-(trifluoromethanesulfonyloxy)naphthalimide, etc.

The disulfonyl diazomethane compounds include for example bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyl diazomethane, etc.

The compound that generates an acid by the action of light or heat also includes sulfonic acid ester compounds such as benzoin tosylate, pyrogallol methane sulfonic acid triester and nitrobenzyl-9,10-diethoxyanthracene-2-sulfonate, etc., and halogen compounds such as phenyl-bis(trichloromethyl)-s-triazine, etc.

These acid compounds can be used alone or in a combination of two or more.

When the underlayer coating forming composition of the present invention is a composition compound containing the polymer having structural units of formulae (A-1), (C-1) and (D-1) wherein in structural units constituting the polymer, the structural unit of formula (A-1) is contained in a molar ratio of 0.3 to 0.8, the structural unit of formula (C-1) is contained in a molar ratio of 0.1 to 0.6 and the structural unit of formula (D-1) is contained in a molar ratio of 0.1 to 0.6, these polymers can take place crosslink reaction each other. That is, in the baking process after coating the underlayer coating forming composition on a semiconductor substrate, the carboxylic acid ester structure present in the structural unit of formula (D-1) occurs thermal decomposition to generate carboxy group (equation (EQ1)). Then, the resulting carboxy group reacts with an epoxy group present in the structural unit of formula (C-1) (equation (EQ2)).

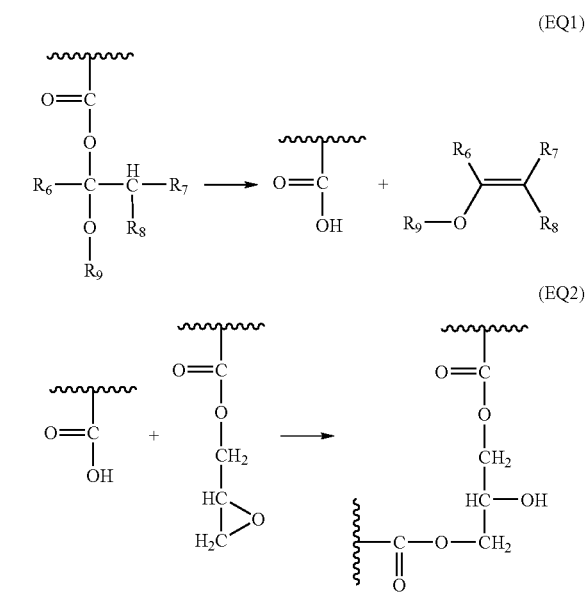

And, in case where the reaction of carboxy group with epoxy group occurs between the polymers, the polymers are crosslinked each other. A number of the reactions between the polymers lead to the formation of a tough underlayer coating having crosslink structure. Consequently, the underlayer coating becomes a coating having a further lowered solubility in an organic solvent generally used for the photoresist composition applied thereon.

When the polymer having the structural units of formulae (A-1), (C-1) and (D-1) is used, the underlayer coating having crosslink structure can be formed without using the crosslinking compound. That is, the use of the polymer having the structural units of formulae (A-1), (C-1) and (D-1) can lead to an underlayer coating having crosslink structure from an underlayer coating forming composition comprising the polymer and the solvent and comprising no crosslinking compound, or from an underlayer coating forming composition comprising the polymer, the acid compound and the solvent and comprising no crosslinking compound.

The underlayer coating forming composition of the present invention can contain optionally other polymers, light absorbing compounds, rheology controlling agents, and surfactants, etc.

The other polymers include polymers produced from addition polymerizable compounds. They are addition polymerized polymers produced from addition polymerizable compounds such as acrylic acid ester compounds, methacrylic acid ester compounds, acrylamide compounds, methacrylamide compounds, vinyl compounds, styrene compounds maleimide compounds, maleic anhydride and acrylonitrile, etc. In addition, they are polyester, polyamide, polyimide, polyamic acid, polycarbonate, polyether, phenol novolak, cresol novolak, and naphthol novolak, etc. When the other polymer is used, the used amount thereof is for example 0.1 to 40 mass % in the solid content.

The light absorbing compounds can be used without any limitation so long as they have a high absorption for light at photosensitive characteristic wavelength region of photosensitive components in a photoresist provided on the underlayer coating. As the light absorbing compounds, can be used benzophenone compounds, benzotriazole compounds, azo compounds, naphthalene compounds, anthracene compounds, anthraquinone compounds, triazine compounds, triazine trione compounds, quinoline compounds and the like. Naphthalene compounds, anthracene compounds, triazine compounds and triazine trione compounds are preferably used. Concrete examples include for example 1-naphthalene carboxylic acid, 2-naphthalene carboxylic acid, 1-naphthol, 2-naphthol, naphthyl acetate, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene dicarboxylic acid, 9-anthracene carboxylic acid, 10-bromo-9-anthracene carboxylic acid, anthracene-9,10-dicarboxylic acid, 1-anthracene carboxylic acid, 1-hydroxyanthracene, 1,2,3-anthracenetriol, 9-hydroxymethylanthracene, 2,7,9-anthracenetriol, benzoic acid, 4-hydroxybenzoic acid, 4-bromobenzoic acid, 3-iodobenzoic acid, 2,4,6-tribromophenol, 2,4,6-tribromoresorcinol, 3,4,5-triiodobenzoic acid, 2,4,6-triiodo-3-aminobenzoic acid, 2,4,6-triiodo-3-hydroxybenzoic acid, 2,4,6-tribromo-3-hydroxybenzoic acid and the like.

In addition, the light absorbing compounds include for example polymers having the structural unit of formula (31), (32) or (33), or the compound of formula (34), and so on. In formula (34), Ar is benzene ring, naphthalene ring or anthracene ring that may be substituted by a substituent selected from the group consisting of $C_{1-6}$alkyl group, $C_{1-6}$alkoxy group, fluorine atom, chlorine atom, bromine atom, iodine atom, nitro group, cyano group, hydroxy group, thiol group, $C_{1-6}$thioalkyl group, carboxyl group, phenoxy group, acetyl group, $C_{1-6}$alkoxycarbonyl group or vinyl group.

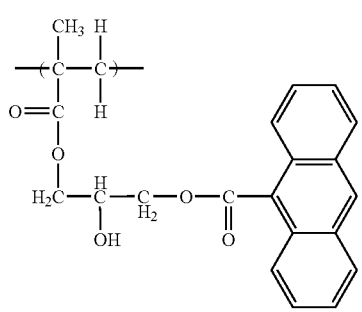

(31)

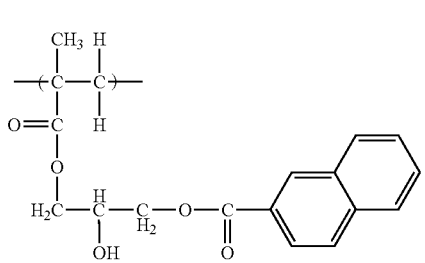

(32)

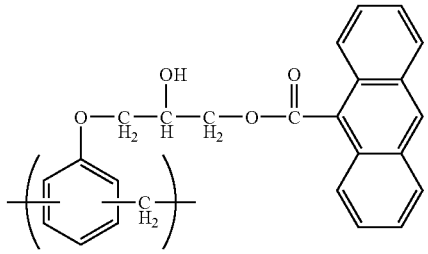

(33)

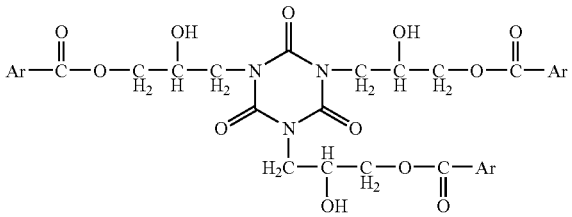

(34)

These light absorbing compounds can be used alone or in a combination of two or more. When the light absorbing compounds are used, the used amount thereof is for example 0.1 to 40 mass % in the solid content.

The rheology controlling agents include for example phthalic acid compounds such as dimethyl phthalate, diethyl phthalate, diisobutyl phthalate, dihexyl phthalate, butyl isodecyl phthalate, etc., adipic acid compounds such as di-n-butyl adipate, diisobutyl adipate, diisooctyl adipate, octyldecyl adipate, etc., maleic acid compounds such as di-n-butyl maleate, diethyl maleate, dinonyl maleate, etc., oleic acid compounds such as methyl oleate, butyl oleate, tetrahydrofurfuryl oleate, etc., stearic acid compounds such as n-butyl stearate, glyceryl stearate, etc. When the rheology controlling agents are used, the used amount thereof is for example 0.01 to 10 mass % in the solid content.

As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be added alone or in combination of two or more. When the surfactant is used, the used amount thereof is for example 0.0001 to 5 mass % in the solid content.

The solvent used for the underlayer coating forming composition according to the present invention can be used without specific limitation if it can dissolve the above-mentioned solid content. Such solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, etc. These solvents may be used alone or in combination of two or more. Further, high boiling solvents such as propylene glycol monobutyl ether or propylene glycol monobutyl ether acetate, etc. may be mixed and used.

Hereinafter, the utilization of the underlayer coating forming composition for lithography according to the present invention is described.

On a semiconductor substrate (for example, silicon/silicon dioxide coat substrate, silicon nitride substrate, glass substrate, ITO substrate or the like), the underlayer coating forming composition according to the present invention is coated by a suitable coating method, for example, with a spinner, a coater or the like, and thereafer the substrate isbaked to fabricate an underlayer coating. The conditions of baking are suitably selected from baking temperature of 80 to 250° C. and baking time of 0.3 to 60 minutes. Preferably the baking temperature is 130 to 250° C. and the baking time is 0.5 to 5 minutes. The thickness of the underlayer coating is for example 0.01 to 3.0 μm, or for example 0.02 to 1.0 μm, or for example 0.03 to 0.5 μm.

The underlayer coating forming composition according to the present invention can be used for semiconductor substrates having holes (via holes) of an aspect ratio shown in height/diameter of 1 or more which is often used in dual damascene process.

Next, a photoresist layer is formed on the underlayer coating. The formation of the photoresist layer can be conducted by well-known process, that is, by application of a photoresist composition solution on the underlayer coating and baking.

The photoresist to be coated and formed on the underlayer coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned.

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake (PEB) may be performed, if necessary. The post exposure bake is conducted by suitably selecting from a heating temperature of 70 to 150° C. and a heating time of 0.3 to 10 minutes.

Next, development is conducted by use of a developerfor photoresist. For example in case where a developer for positive type photoresist is used, the development results in removal of exposed part of the photoresist and forming of photoresist pattern.

The developer for photoresist includes for example alkaline aqueous solution e.g., an aqueous solutions of alkali metal hydroxide such as potassium hydroxide, sodium hydroxide or the like, aqueous solution of quaternary ammonium hydroxide such as tetramethylammonium hydroxide, tetraethylammonium hydroxide, chlorine or the like, amine aqueous solution such as ethanolamine, propylamine, ethylenediamine or the like. Further, surfactants can be added in these developers. The condition of development is suitably selected from a temperature of 5 to 50° C. and a time of 10 to 300 seconds.

Then, removal of the underlayer coating and processing of the semiconductor substrate are conducted by using the photoresist pattern formed as mentioned above as a protective coating. The removal of the underlayer is conducted by use of a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, etc.

Before or after forming the underlayer coating of the present invention on a semiconductor substrate, an organic anti-reflective coating layer may be applied and formed. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. In addition, the semiconductor substrates on which the underlayer coating forming composition of the present invention is applied may be substrates on which an inorganic anti-reflective coating is formed by CVD method or the like, and the underlayer coating of the present invention can be formed thereon.

The underlayer coating formed from the underlayer coating forming composition of the present invention may contain an absorption for light used in the lithography process. In such a case, the underlayer coating can be used as a layer having a preventive effect against light reflected from the substrate, that is, as an anti-reflective coating.

Further, the underlayer coating of the present invention can be usedas a layer for preventing an interaction between the substrate and the photoresist, as a layer having a function that prevents an adverse effect against the substrate by the material used for the photoresist or by substances formed on exposure to light of the photoresist, as a layer having a function that prevents diffusion and adverse effects of substances formed in the substrate on baking under heating to the upper layer photoresist, or as a barrier layer for reducing any poisoning effect of the photoresist layer by the semiconductor substrate dielectric layer.

In addition, the underlayer coating formed from the underlayer coating forming composition of the present invention can be used as a filling agent that can fill via holes without gap or as a flattening agent for flattening a substrate surface, by applying it for the substrate on which via holes are formed and which is used in dual damascene process.

Hereinafter, the present invention will be described based on examples but the present invention is not limited thereto.

EXAMPLES

Synthetic Example 1

In 17.97 g of propylene glycol monomethyl ether acetate, 2.00 g of 1-ethoxyethyl methacrylate (product of Honshu Chemical Industry Co., Ltd.), 1.799 g of glycidyl methacrylate, and 5.902 g of 8-bromo-2-vinylnaphthalene (product of Nippon Steel Chemical Co., Ltd.) were dissolved, nitrogen was flowed to the reaction solution for 30 minutes, and then the temperature was raised to 70° C. While maintaining the reaction solution at 70° C., 0.077 g of azobisisobutyronitrile and 0.077 g of 1-dodecane thiol were added. After stirring under nitrogen atmosphere at 70° C. for 8 hours, 0.021 g of 4-methoxyphenol was added to obtain a solution containing a copolymer of 1-ethoxyethyl methacrylate, glycidyl methacrylate and 8-bromo-2-vinylnaphthalene. GPC analysis of the resulting polymer showed that it had a number average molecular weight Mn of 15000 and a weight average molecular weight Mw of 28500 (in terms of standard polystyrene).

Synthetic Example 2

In 25.7 g of propylene glycol monomethyl ether acetate, 2.0 g of 2-hydroxyethyl acrylate and 16.08 g of 8-bromo-2-vinylnaphthalene (product of Nippon Steel Chemical Co., Ltd.) were dissolved, nitrogen was flowed to the reaction solution for 30 minutes, and then the temperature was raised to 70° C. While maintaining the reaction solution at 70° C., 0.18 g of azobisisobutyronitrile and 0.18 g of 1-dodecane thiol were added. After stirring under nitrogen atmosphere at 70° C. for 8 hours, 0.05 g of 4-methoxyphenol was added to obtain a solution containing a copolymer of hydroxyethyl acrylate and 8-bromo-2-vinylnaphthalene. GPC analysis of the resulting polymer showed that it had a number average molecular weight Mn of 10000 and a weight average molecular weight Mw of 24000 (in terms of standard polystyrene).

Synthetic Example 3

In 179.7 g of propylene glycol monomethyl ether acetate, 20.0 g of 1-ethoxyethyl methacrylate (product of Honshu Chemical Industry Co., Ltd.), 17.99 g of glycidyl methacrylate, and 39.04 g of 2-vinyinaphthalene (product of Nippon Steel Chemical Co., Ltd.) were dissolved, nitrogen was flowed to the reaction solution for 30 minutes, and then the temperature was raised to 70° C. While maintaining the reaction solution at 70° C., 0.77 g of azobisisobutyronitrile and 0.77 g of 1-dodecane thiol were added. After stirring under nitrogen atmosphere at 70° C. for 8 hours, 0.21 g of 4-methoxyphenol was added to obtain a solution containing a copolymer of 1-ethoxyethyl methacrylate, glycidyl methacrylate and 2-vinylnaphthalene. GPC analysis of the resulting polymer showed that it had a number average molecular weight Mn of 10500 and a weight average molecular weight Mw of 21000 (in terms of standard polystyrene).

Synthetic Example 4

In 179.7 g of propylene glycol monomethyl ether acetate, 20.0 g of 2-hydroxyethyl acrylate and 106.35 g of 2-vinylnaphthalene (product of Nippon Steel Chemical Co., Ltd.) were dissolved, nitrogen was flowed to the reaction solution for 30 minutes, and then the temperature was raised to 70° C. While maintaining the reaction solution at 70° C., 1.26 g of azobisisobutyronitrile and 1.26 g of 1-dodecane thiol were added. After stirring under nitrogen atmosphere at 70° C. for 8 hours, 0.34 g of 4-methoxyphenol was added to obtain a solution containing a copolymer of hydroxyethyl acrylate and 2-vinyinaphthalene. GPC analysis of the resulting polymer showed that it had a number average molecular weight Mn of 12000 and a weight average molecular weight Mw of 22000 (in terms of standard polystyrene).

Example 1

In 10 g of a solution (concentration: 30 mass %) containing the polymer obtained in Synthesis Example 1, 6.52 g of ethyl lactate and 5.80 g of propylene glycol monomethyl ether acetate were added to obtain a solution having a solid content concentration of 13.5 mass %. Thereafter, the solution was filtered through a micro filter made of polyethylene having a pore diameter of 0.05 µm to prepare an underlayer coating forming composition solution.

Example 2

In 10 g of a solution (concentration: 30 mass %) containing the polymer obtained in Synthesis Example 2, 0.69 g of hexamethoxymethyl melamine, 0.007 g of pyridinium-p-toluene sulfonate, 8.00 g of propylene glycol monomethyl ether, and 8.58 g of propylene glycol monomethyl ether acetate were added to obtain a solution having a solid content concentration of 11.5 mass %. Thereafter, the solution was filtered through a micro filter made of polyethylene having a pore diameter of 0.05 µm to prepare an underlayer coating forming composition solution.

Example 3

In 10 g of a solution (concentration: 30 mass %) containing the polymer obtained in Synthesis Example 2, 0.69 g of tetramethoxymethyl glycol uril, 0.005 g of pyridinium-p-toluene sulfonate, 5.45 g of propylene glycol monomethyl ether, and 8.60 g of propylene glycol monomethyl ether acetate were added to obtain a solution having a solid content concentration of 11.5 mass %. Thereafter, the solution was filtered through a micro filter made of polyethylene having a pore diameter of 0.05 µm to prepare an underlayer coating forming composition solution.

Comparative Example 1

In 10 g of a solution (concentration: 30 mass %) containing the polymer obtained in Synthesis Example 3, 6.52 g of ethyl lactate and 5.80 g of propylene glycol monomethyl ether acetate were added to obtain 13.5 mass % solution. Thereafter, the solution was filtered through a micro filter made of polyethylene having a pore diameter of 0.05 µm to prepare an underlayer coating forming composition solution.

Comparative Example 2

In 10 g of a solution (concentration: 30 mass %) containing the polymer obtained in Synthesis Example 4, 1.38 g of hexamethoxymethyl melamine, 0.014 g of pyridinium-p-toluene sulfonate, 15.99 g of propylene glycol monomethyl ether, and 17.15 g of propylene glycol monomethyl ether acetate were added to obtain a solution having a solid content concentration of 11.5 mass %. Thereafter, the solution was filtered through a micro filter made of polyethylene having a pore diameter of 0.05 μm to prepare an underlayer coating forming composition solution.

Comparative Example 3

In 10 g of a solution (concentration: 30 mass %) containing the polymer obtained in Synthesis Example 4, 1.38 g of tetramethoxymethyl glycol uril, 0.011 g of pyridinium-p-toluene sulfonate, 10.99 g of propylene glycol monomethyl ether, and 17.20 g of propylene glycol monomethyl ether acetate were added to obtain a solution having a solid content concentration of 11.5 mass %. Thereafter, the solution was filtered through a micro filter made of polyethylene having a pore diameter of 0.05 μm to prepare an underlayer coating forming composition solution.

Dissolution Test in Photoresist Solvent

The underlayer coating forming composition solutions prepared in Examples 1 to 3 and Comparative Examples 1 to 3 were coated on semiconductor substrates (silicon wafers) by means of a spinner. The coated silicon wafers were baked at 205° C. for 1 minute on a hot plate to form underlayer coatings (film thickness 0.22 μm). The underlayer coatings were dipped in a solvent used for photoresists, ethyl lactate, propylene glycol monomethyl ether acetate, and propylene glycol monomethyl ether and as a result it was confirmed that the resulting underlayer coatings were insoluble in these solvents.

Test of Intermixing with Photoresist

The underlayer coating forming composition solutions prepared in Examples 1 to 3 and Comparative Examples 1 to 3 were coated on silicon wafers by means of a spinner. The coated silicon wafers were baked at 205° C. for 1 minute on a hot plate to form underlayer coatings (film thickness 0.20 μm). On each underlayer coating was coated a commercially available photoresist solution (trade name: GARS 8105G1 manufactured by Fuji Photo Film Co., Ltd. and trade name: SEPR 430 manufactured by Shinetsu Chemical Co., Ltd.) by means of a spinner. The coated wafers were heated at 90° C. or 11° C. for 1.5 minute on a hot plate to form photoresists. After exposure of the photoresists to light, post exposure bake was performed at 90° C. for 1.5 minute. After developing the photoresists, the film thickness of the underlayer coatings was measured and it was confirmed that no intermixing occurred between the underlayer coatings and the photoresists.

Measurement of Optical Parameter

The underlayer coating forming composition solutions prepared in Examples 1 to 3 and Comparative Examples 1 to 3 were coated on silicon wafers by means of a spinner. The coated silicon wafers were baked at 205° C. for 1 minute on a hot plate to form underlayer coatings (film thickness 0.20 μm). On the underlayer coating, refractive index (n) and attenuation coefficient (k) at a wavelength of 248 nm were measured with a spectroscopic ellipsometer. The results are shown in Table 1.

Measurement of Dry Etching Rate

The underlayer coating forming composition solutions prepared in Examples 1 to 3 and Comparative Examples 1 to 3 were coated on silicon wafers by means of a spinner. The coated silicon wafers were baked at 205° C. for 1 minute on a hot plate to form underlayer coatings (film thickness 0.20 μm).

In addition, a photoresist solution (trade name: SEPR 430 manufactured by Shinetsu Chemical Co., Ltd.) was coated on a silicon wafer by means of a spinner, and baked at 110° C. for 1.5 minute on a hot plate to form a photoresist. Then, dry etching rate on the underlayer coatings and the photoresist was measured with RIE system ES401 manufactured by Nippon Scientific Co., Ltd. under the condition in which $CF_4$ was used as dry etching gas. The results are shown in Table 1.

TABLE 1

|  | (I) | (II) | (III) | (IV) |
|---|---|---|---|---|
| Example 1 | 0.5 | 2.10 | 0.19 | 1.30 |
| Example 2 | 0.8 | 2.18 | 0.28 | 1.13 |
| Example 3 | 0.8 | 2.18 | 0.29 | 1.16 |
| Comparative Example 1 | 0.5 | 2.03 | 0.10 | 1.10 |
| Comparative Example 2 | 0.8 | 2.00 | 0.15 | 0.90 |
| Comparative Example 3 | 0.8 | 2.01 | 0.16 | 0.91 |

In Table 1, (I) shows molar ratio of structural unit having naphthalene ring in the polymer used in each example, (II) shows refractive index (n), (III) shows attenuation coefficient (k), and (IV) shows dry etching rate of each underlayer coating in case where the dry etching rate of the photoresist is regarded as 1.00.

The invention claimed is:

1. An underlayer coating forming composition for lithography comprising a polymer having structural units of formulae (A-1) and (B-1):

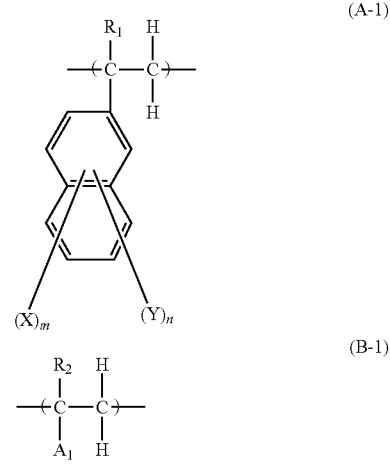

wherein $R_1$ is hydrogen atom or methyl group, X is bromine atom, Y is a group selected from the group consisting of hydrogen atom, $C_{1-6}$alkyl group, $C_{1-6}$alkoxy group, cyano group, nitro group, carboxy group, hydroxy group, $C_{1-6}$alkoxycarbonyl group and $C_{1-6}$thioalkyl group, m is an integer of 1 to 7, n is an integer of 0 to 6 and m+n =7, in case where n is 2 or more, each Y group is either identical or different, $R_2$ is hydrogen atom or methyl group, $A_1$ is hydroxyphenyl group, hydroxy group, 2-hydroxyethyloxy group or —$COOR_3$ wherein $R_3$ is $C_{2-6}$alkyl group substituted with at least one hydroxy group, and a solvent, wherein in structural units constituting the polymer, the structural unit of formula (A-1) is contained in a molar ratio of 0.3 to 0.9 and the structural unit of formula (B-1) is contained in a molar ratio of 0.1 to 0.7.

2. An underlayer coating forming composition for lithography according to claim 1, further comprising a crosslinking compound, and an acid compound.

3. The underlayer coating forming composition for lithography according to claim 1, wherein the structural unit of formula (A-1) is a structural unit of formula (A-2):

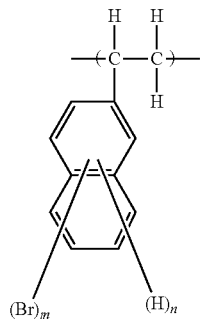

(A-2)

wherein m is an integer of 1 to 7, n is an integer of 0 to 6 and m+n=7.

4. The underlayer coating forming composition for lithography according to claim 1, wherein the structural unit of formula (B-1) is a structural unit of formula (B-2):

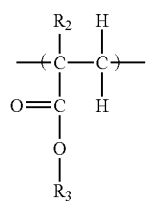

(B-2)

wherein $R_2$ is hydrogen atom or methyl group, and $R_3$ is $C_{2-6}$alkyl group substituted with at least one hydroxy group.

5. The underlayer coating forming composition for lithography according to claim 2, wherein the crosslinking compound is a compound having two or more nitrogen atoms substituted with hydroxymethyl group or alkoxymethyl group.

6. The underlayer coating forming composition for lithography according to claim 2, wherein the acid compound is a sulfonic acid compound.

7. The underlayer coating forming composition for lithography according to claim 2, wherein the acid compound is a sulfonium salt compound or a iodonium salt compound.

8. An underlayer coating obtained by coating the underlayer coating forming composition for lithography according to claim 1 on a semiconductor substrate, and baking it.

9. A method for forming photoresist pattern for use in manufacture of semiconductor device, comprising the steps:
coating the underlayer coating forming composition for lithography according to claim 1 on a semiconductor substrate, and baking it to form an underlayer coating, forming a photoresist layer on the underlayer coating, exposing the semiconductor substrate covered with the underlayer coating and the photoresist layer to light, and developing after the exposure to light.

10. An underlayer coating forming composition for lithography comprising a polymer having structural units of formulae (A-1), (C-1) and (D-1):

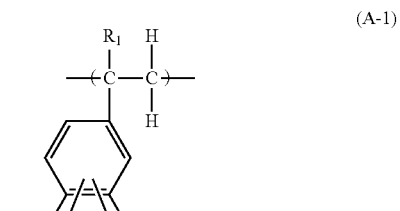

(A-1)

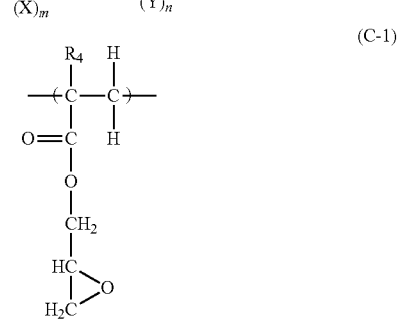

(C-1)

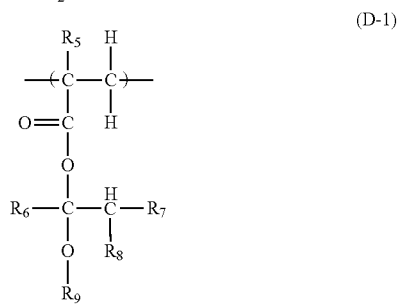

(D-1)

wherein $R_1$ is hydrogen atom or methyl group, X is halogen atom, Y is a group selected from the group consisting of hydrogen atom, $C_{1-6}$alkyl group, $C_{1-6}$alkoxy group, cyano group, nitro group, carboxy group, hydroxy group, $C_{1-6}$alkoxycarbonyl group and $C_{1-6}$thioalkyl group, m is an integer of 1 to 7, n is an integer of 0 to 6 and m+n=7, in case where m and n are 2 or more, X and Y are identical with or different from each other, $R_4$ and $R_5$ independently of each other are hydrogen atom or methyl group, $R_6$, $R_7$ and $R_8$ independently of one another are hydrogen atom or $C_{1-10}$alkyl group, $R_9$ is $C_{1-10}$alkyl group, or $R_8$ and $R_9$ may be bonded together to form a ring, and a solvent, wherein in structural units constituting the polymer, the structural unit of formula (A-1) is contained in a molar ratio of 0.3 to 0.8, the structural unit of formula (C-1) is contained in a molar ratio of 0.1 to 0.6 and the structural unit of formula (D-1) is contained in a molar ratio of 0.1 to 0.6.

* * * * *